(12) United States Patent
Baader

(10) Patent No.: US 12,382,590 B2
(45) Date of Patent: Aug. 5, 2025

(54) MOUNT FOR A CIRCUIT BOARD

(71) Applicant: Siemens Aktiengesellschaft, Munich (DE)

(72) Inventor: Mathias Baader, Rastatt (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 358 days.

(21) Appl. No.: 18/171,880

(22) Filed: Feb. 21, 2023

(65) Prior Publication Data

US 2023/0269888 A1  Aug. 24, 2023

(30) Foreign Application Priority Data

Feb. 23, 2022  (EP) .................................. 22158286

(51) Int. Cl.
*H05K 5/00* (2025.01)
(52) U.S. Cl.
CPC ................... *H05K 5/0069* (2013.01)
(58) Field of Classification Search
CPC .... H01R 12/716; H01R 13/746; H01R 13/02; H01R 13/74; H05K 5/006; H05K 7/142; H05K 7/14; G02B 6/3807
See application file for complete search history.

(56) References Cited

U.S. PATENT DOCUMENTS

| 6,186,800 B1 | 2/2001 | Klein | 439/95 |
| 2004/0023540 A1 | 2/2004 | Schadhauser | 439/236 |
| 2012/0257365 A1 | 10/2012 | Söfker | H05K 7/00 |
| 2014/0127936 A1 | 5/2014 | Leroyer et al. | 439/527 |
| 2018/0354434 A1 | 12/2018 | Kaneko | B60R 16/023 |
| 2019/0159351 A1 | 5/2019 | Tsao | H05K 5/00 |
| 2020/0060030 A1 * | 2/2020 | Su | H02G 11/02 |

FOREIGN PATENT DOCUMENTS

| DE | 30 11 243 | 10/1981 | | |
| DE | 102 26 761 | 1/2004 | | |
| DE | 10 2009 059 013 | 6/2011 | | |
| DE | 11 2016 004 757 | 7/2018 | | |
| EP | 2728674 A1 * | 5/2014 | ......... | H01R 12/7052 |
| WO | WO-03030092 A1 * | 4/2003 | ............ | G06F 3/016 |

\* cited by examiner

*Primary Examiner* — Jean F Duverne
(74) *Attorney, Agent, or Firm* — Slayden Grubert Beard PLLC

(57) ABSTRACT

Various embodiments of the teachings herein include an arrangement for fastening a circuit board. The arrangement may include: a first tubular fastening element with a first conductor inside; a protrusion for mechanical fastening; a first opening; and a housing wall with a second opening. The first fastening element is fed through the first opening. The first fastening element is fixed to the mount. There is a first terminal for rigid connection. The first terminal is on the end of the first fastening element, fed through the second opening. The first fastening element is fixed to the housing wall. The mount comprises a first side and a second side opposite the first side. The first side of the mount is oriented in the direction of the housing wall. The protrusion projects from the second side of the mount. The mount is arranged between the housing wall and the first terminal.

12 Claims, 2 Drawing Sheets

MOUNT FOR A CIRCUIT BOARD

CROSS-REFERENCE TO RELATED APPLICATIONS

This application claims priority to EP Application No. 22158286.9 filed Feb. 23, 2022, the contents of which are hereby incorporated by reference in their entirety.

TECHNICAL FIELD

The present disclosure relates to circuit boards. Various embodiments of the teachings herein include mounts for a circuit board wherein the mount is secured in relation to a housing of a device.

BACKGROUND

Electrical devices such as for example controllers of gas burners and/or of oil burners and/or of valves are frequently to be protected against the effects of foreign bodies. Furthermore such devices are frequently to be protected against the effects of water. In such cases, depending on protection class, a protection against foreign bodies with specific diameters, for example twelve millimeters or 2.5 millimeters or one millimeter, is provided. Furthermore a protection against dust and even a complete protection against the entry of dust are possible.

A protection against the effects of dust and/or foreign bodies and/or water in many cases requires an extensive technical separation of the mechanical fastening of a board to the housing from the electrical wiring. A particular challenge in this case is managing the chain of tolerances within the device to be protected. Thus any contact carriers for screwing to the housing are to be aligned precisely. At the same time a circuit board is to be fastened mechanically in the housing. The mutual alignment of circuit board, contact carriers and housing is in some cases ensured with a high degree of technical effort.

In many cases what are known as cable-to-circuit board plug-in connectors are used to manage the chain of tolerances. In this case a flexible electrical connection, for example a ribbon cable and/or a ribbon connector, is fastened with the aid of a plug to a socket. For example, within the framework of such cable-to-circuit board connections, plugs and sockets are attached to printed circuit boards.

That socket, plug and those flexible electrical connections are additional components within a device, for example within a valve controller. Plugs and sockets can come loose, as a result of mechanical vibrations among other things. Flexible electrical connections such as ribbon cables and/or ribbon plugs and in particular such flexible connections made of copper wires withstand a limited number of alternating bending cycles. Subsequently such flexible electrical connections can break. The disconnection of a plug connector and also the breakage of a flexible electrical connection lead in many cases to the failure of the device.

A German patent application DE3011243A1 deals with a locking apparatus for a bearing axis. In this document, a plate is secured with the aid of a fastening. The fastening comprises a head and a shaft. To secure the plate on the shaft diametral webs protrude from the shaft. The webs have cams that interact with locking holes to secure the plate. The shaft in its turn comprises a blind hole in which a bearing axis is rotatably supported.

A further patent application DE10226761A1 deals with a bayonet socket for a lamp mount. DE10226761A1 teaches a lamp mount with a bayonet connector. The bayonet male connector is able to be twisted using a bayonet female connector into a first vessel half of the lamp mount. The first vessel half of the lamp mount bears a circuit board for an electrical starter device. A second vessel half of the lamp mount comprises a receptacle for a fluorescent lamp. The bayonet male connector is able to be twisted into the first vessel half of the lamp mount but not into the second vessel half. Screw clamps or plug-in clamps are provided for connection to a wall. These clamps allow fastening to a wall with the aid of flexible electrical leads.

Yet another German patent application DE102009059013A1 deals with a facility for fastening at least one circuit board to a receiving element. The receiving element from DE102009059013A1 is connected to three circuit boards with the aid of a fastening. An opening in the circuit boards makes it possible to pass the fastening through the circuit boards. The circuit boards are fixed centrally to the receiving element with the aid of mounting elements.

The document DE112016004757T5 deals with an electronic control facility containing a control board and a connector.

A patent application US2019/159351A1 describes a circuit board module and also an electronic device are disclosed.

U.S. Pat. No. 6,186,800B1 deals with a circuit board grounding and a support structure.

SUMMARY

The teachings of the present disclosure may be used to fasten a circuit board within a housing so that on the one hand protection against dust and/or foreign bodies and/or water is guaranteed. On the other hand flexible electrical connections such as for example ribbon cables are largely to be dispensed with. For example, some embodiments include an arrangement for fastening a circuit board (4), the arrangement comprising: a first tubular fastening element (6) and at least one first conductor inside the first tubular fastening element (6); the arrangement additionally comprising a mount (2) for the circuit board (4); wherein the mount (2) comprises at least one protrusion for mechanical fastening of the circuit board (4); wherein the mount (2) comprises a first opening; wherein the first tubular fastening element (6) is fed through the first opening in the mount (2); wherein the first tubular fastening element (6) is connected mechanically to the mount (2) on a fixed basis in such a way that the mount (2) is essentially stationary in relation to the first tubular fastening element (6); the arrangement additionally comprising a first terminal for rigid connection of the at least one first conductor to the circuit board (4); wherein the first tubular fastening element (6) comprises an end that is oriented away from the mount (2); wherein the first terminal is arranged on the end of the first tubular fastening element (6); characterized in that the arrangement additionally comprises a housing wall (1); wherein the housing wall (1) comprises a first opening; wherein the first tubular fastening element (6) is fed through the first opening in the housing wall (1); wherein the first tubular fastening element (6) is connected mechanically to the housing wall (1) on a fixed basis in such a way that the housing wall (1) is essentially stationary in relation to the first tubular fastening element (6); wherein the mount (2) comprises a first and a second side; wherein the second side of the mount (2) is different from the first side of the mount (2) and the second side of the mount (2) lies opposite the first side of the mount (2) and the first side of the mount (2) is oriented in the direction of the housing wall (1); wherein the at least one protrusion for mechanical fastening of the circuit board (4) projects from the second side of the mount (2); and wherein the mount (2) is arranged between the housing wall (1) and the first terminal.

In some embodiments, the first terminal comprises a first electrical terminal and the at least one first conductor comprises at least one first electrical conductor.

In some embodiments, the first terminal comprises a first terminal for an optical waveguide and the at least one first conductor comprises at least one first optical waveguide.

In some embodiments, the first tubular fastening element (6) is arranged at right angles to the mount (2).

In some embodiments, the mount (2) and the at least one protrusion for mechanical fastening of the circuit board (4) are made from one piece.

In some embodiments, the first tubular fastening element (6) is arranged at right angles to the housing wall (1).

In some embodiments, the first tubular fastening element (6) is the only mechanical connection between the mount (2) and the housing wall (1).

In some embodiments, the first terminal comprises a first male or female screw-on plug, so that the first male or female screw-on plug makes possible the rigid connection of the at least one first conductor to the circuit board (4).

In some embodiments, the arrangement comprises: a second tubular fastening element (7) and at least one second conductor inside the second tubular fastening element (7); wherein the mount (2) comprises a second opening; wherein the second tubular fastening element (7) is fed through the second opening in the mount (2); the arrangement additionally comprising a second terminal for rigid connection of the at least one second conductor to the circuit board (4); wherein the second tubular fastening element (7) comprises an end that is oriented away from the mount (2); and wherein the second terminal is arranged at the end of the second tubular fastening element (7).

In some embodiments, the second tubular fastening element (7) is connected mechanically to the mount (2) on a fixed basis in such a way that the mount (2) is essentially stationary in relation to the second tubular fastening element (7).

In some embodiments, the second tubular fastening element (7) is arranged parallel to the first tubular fastening element (6).

In some embodiments, the second terminal comprises a second male or female screw-on plug, wherein the second male or female screw-on plug comprises an elastic element, so that the elastic element and the second male or female screw-on plug afford the rigid connection of the at least one second conductor to the circuit board (4).

BRIEF DESCRIPTION OF THE DRAWINGS

Various features will become evident to the person skilled in the art from the more detailed description of the disclosed non-restrictive embodiments described below. The drawings that accompany the more detailed description can be briefly described as follows.

DETAILED DESCRIPTION

Figure 1:
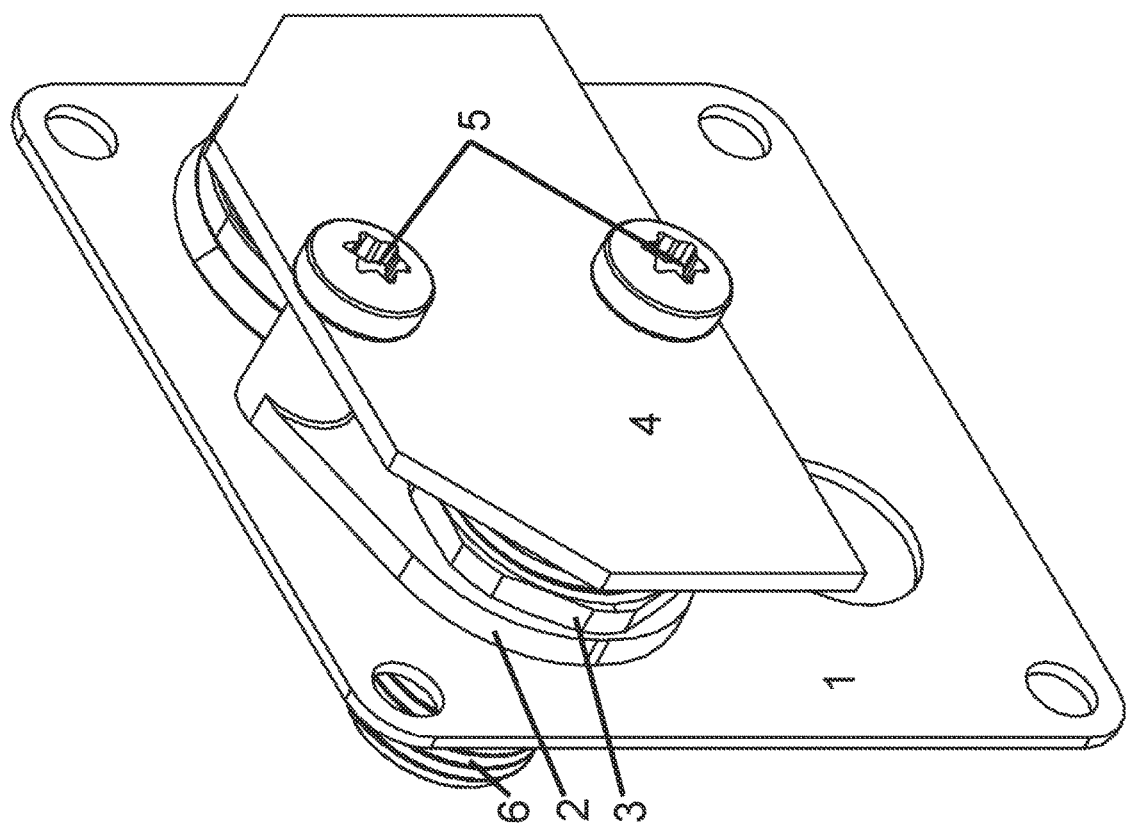
FIG. 1 shows a perspective diagram of a part of the device with circuit board holder, circuit board, housing, and screw fastening incorporating teachings of the present disclosure.

The teachings of the present disclosure include circuit board holders for installation in a device. The device can for example be an electrical and/or electronic device. In particular the device can be an open-loop controller for a gas burner and/or an oil burner. The device can further be a closed-loop controller for a gas burner and/or an oil burner. What is more the device can comprise an open-loop controller and/or a closed-loop controller for a valve. In particular the device can comprise an open-loop controller and/or a closed-loop controller for a valve. Moreover the device can comprise an open-loop controller and/or a closed-loop controller for a valve drive. In particular the device can comprise an open-loop controller and/or a closed-loop controller for a valve drive.

The circuit board holder is fastened with the aid of a fastening element to a housing of the device. In this case the fastening element has a fixed mechanical connection to the housing in such a way that the fastening element cannot be moved in relation to the housing. Moreover the fastening element has a fixed mechanical connection to the circuit board holder in such a way that the fastening element cannot be moved in relation to the circuit board holder. In some embodiments, the fastening element comprises at least one screw fastening. In some embodiments, the fastening element is screwed to the housing of the device. In some embodiments, the fastening element is screwed to the circuit board holder. In some embodiments, the fastening element is screwed to the housing of the device and to the circuit board holder.

A circuit board can be fastened to the circuit board holder so that it is located within the device. In this case the housing of the device defines an inner area of the device. The circuit board can be mechanically fastened to the circuit board holder so that the circuit board is stationary in relation to the circuit board holder.

In some embodiments, the circuit board holder comprises at least one mount. The circuit board holder can in particular comprise two or three or four mounts. In some embodiments, the circuit board holder is connected to the circuit board with the aid of the at least one mount in the form of a screw fastening. In some embodiments, the circuit board holder is connected to the circuit board with the aid of two mounts in the form of screw fastenings. In some embodiments, the circuit board holder is connected to the circuit board with the aid of three mounts in the form of screw fastenings. In some embodiments, the circuit board holder is connected to the circuit board with the aid of four mounts in the form of screw fastenings.

In some embodiments, the circuit board holder is connected to the circuit board with the aid of the at least one mount in the form of a riveted fastening. In some embodiments, the circuit board holder is connected to the circuit board with the aid of two mounts in the form of riveted fastenings. In some embodiments, the circuit board holder is connected to the circuit board with the aid of three mounts in the form of riveted fastenings. In some embodiments, the circuit board holder is connected to the circuit board with the aid of four mounts in the form of riveted fastenings.

In some embodiments, the circuit board holder is connected to the circuit board with the aid of the at least one mount in the form of an adhesive bonding. In some embodiments, the circuit board holder is connected to the circuit board with the aid of two mounts in the form of adhesive bondings. In some embodiments, the circuit board holder is connected to the circuit board with the aid of three mounts in the form of adhesive bondings. In some embodiments, the circuit board holder is connected to the circuit board with the aid of four mounts in the form of adhesive bondings.

In some embodiments, the circuit board holder is connected to the circuit board with the aid of the at least one mount in the form of a latching plug-in connection. In some embodiments, the circuit board holder is connected to the circuit board with the aid of two mounts in the form of latching plug-in connections. In some embodiments, the circuit board holder is connected to the circuit board with the aid of three mounts in the form of latching plug-in connections. In some embodiments, the circuit board holder is connected to the circuit board with the aid of four mounts in the form of latching plug-in connections.

FIG. 1 shows a housing wall 1 of a device, for example of an electrical and/or electronic device incorporating teachings of the present disclosure. The housing wall 1 can for example be made of a metal such as aluminum and/or steel and/or ferritic steel and/or austenitic steel. The housing wall 1 can likewise be made of a plastic such as for example polyvinyl chloride and/or polyethylene terephthalate and/or acrylonitrile butadiene styrene copolymer. The lists of the materials of the housing wall 1 given here are not definitive.

In some embodiments, the housing wall 1 is manufactured in an injection molding method. The housing wall 1 or parts of the housing wall 1 are manufactured according to one aspect of the present disclosure with an additive manufacturing method such as three-dimensional printing. In some embodiments, the manufacturing of the housing wall 1 and/or of parts of the housing wall 1 can be undertaken by selective laser sintering.

The housing wall 1 has a first opening. The first opening in the housing wall 1 has a circular cross section. The first opening in the housing wall 1 can furthermore have a square, rectangular or hexagonal cross section. The list of cross sections of the first opening in the housing wall 1 given here does not make any claim to being complete.

In some embodiments, the first opening in the housing wall 1 is a hole. In some embodiments, the first opening is punched into the housing wall 1. Further technical options for making the first opening in the housing wall 1 are well known. For example, the first opening in the housing wall 1 can be made as a cutout as a part of an additive manufacturing method.

A first threaded bolt 6 is fed through the first opening in the housing wall 1. In some embodiments, the first threaded bolt 6 comprises a first hollow cylinder with a first external thread, for example with a first metric external thread. The first threaded bolt 6 is ideally a first hollow cylinder with a first external thread, for example with a first metric external thread.

The first hollow cylinder of the first threaded bolt 6 is made from a material that is compatible with the material of the housing wall 1. The first hollow cylinder of the first threaded bolt 6 can for example be made of a metal such as aluminum and/or steel and/or ferritic steel and/or austenitic steel and/or brass. The first hollow cylinder of the first threaded bolt 6 can likewise be made of a plastic. The lists of materials of the first hollow cylinder of the first threaded bolt 6 given here are not definitive.

The housing wall 1 has a first and a second side. The first side of the housing wall 1 is different from the second side of the housing wall 1. The first side of the housing wall 1 lies opposite the second side of the housing wall 1. In one form of embodiment the first side of the housing wall 1 is parallel to the second side of the housing wall 1.

In some embodiments, the first side of the housing wall 1 belongs to an outer side of the device, for example to an outer side of the electrical and/or electronic device. In some embodiments, the second side of the housing wall 1 belongs to an inner side of the device, for example to an inner side of the electrical and/or electronic device.

On the first side of the housing wall 1 a first threaded nut is attached to the first threaded bolt 6 so that the first threaded nut rests against the first side of the housing wall 1. In some embodiments, the threaded bolt 6 and the first threaded nut are embodied as a single part, i.e. in one piece. In some embodiments, the first threaded nut comprises a first retaining nut and/or a first flat nut. The first threaded nut is ideally a first retaining nut and/or a first flat nut. The first threaded nut is for example a first threaded nut with a metric thread on an inner side of the first threaded nut. In some embodiments, the threaded bolt 6 and the first retaining nut and/or the first flat nut are embodied as a single part, i.e. in one piece.

The first threaded nut is manufactured from a material that is compatible with the material of the first threaded bolt 6. The first threaded nut is likewise manufactured from a material that is compatible with the material of the housing wall 1. The first threaded nut can for example be manufactured from a metal such as aluminum and/or steel and/or ferritic steel and/or austenitic steel and/or brass. The first threaded nut can likewise be manufactured from a plastic. The lists of materials of the first threaded nut given here are not definitive.

On the second side of the housing wall 1 a second threaded nut is attached to the first threaded bolt 6 so that the second threaded nut rests against the second side of the housing wall 1. In some embodiments, the second threaded nut comprises a second retaining nut and/or a second flat nut. In some embodiments, the second threaded nut is a second retaining nut and/or a second flat nut. In some embodiments, the second threaded nut is for example a second threaded nut with a metric thread on an inner side of the second threaded nut.

The second threaded nut is manufactured from a material that is compatible with the material of the first threaded bolt 6. The second threaded nut is likewise manufactured from a material that is compatible with the material of the housing wall 1. The second threaded nut can for example be manufactured from a metal such as aluminum and/or steel and/or ferritic steel and/or austenitic steel and/or brass. The second threaded nut can likewise be manufactured from a plastic. The lists of materials of the second threaded nut given here are not definitive.

The second threaded nut is arranged lying opposite the first threaded nut. Arranged between the second threaded nut and the first threaded nut is the housing wall 1. The second threaded nut and the first threaded nut fasten the first threaded bolt 6 to the housing wall 1. The fastening takes place in such a way that the first threaded bolt 6 is essentially stationary in relation to the housing wall 1. In some embodiments, the second threaded nut and the first threaded nut fasten the first threaded bolt 6 to the housing wall 1 in such a way that the first threaded bolt 6 is stationary in relation to the housing wall 1. A rigid connection makes possible an exact positioning of the components, in particular an exact positioning of electrical contacts between the components.

In some embodiments, the second retaining nut is arranged lying opposite to the first retaining nut. Arranged between the second retaining nut and the first retaining nut is the housing wall 1. The second retaining nut and the first retaining nut fasten the first threaded bolt 6 to the housing wall 1. The fastening is such that the first threaded bolt 6 is essentially stationary in relation to the housing wall 1. In some embodiments, the second retaining nut and the first retaining nut fasten the first threaded bolt 6 to the housing wall 1 in such a way that the first threaded bolt 6 is stationary in relation to the housing wall 1.

In some embodiments, the second flat nut is arranged lying opposite the first flat nut. Arranged between the second flat nut and the first flat nut is the housing wall 1. The second flat nut and the first flat nut fasten the first threaded bolt 6 to the housing wall 1. The fastening is such that the first threaded bolt 6 is essentially stationary in relation to the housing wall 1. In some embodiments, the second flat nut and the first flat nut fasten the first threaded bolt 6 to the housing wall 1 in such a way that the first threaded bolt 6 is stationary in relation to the housing wall 1.

In some embodiments, the first threaded bolt 6 is screwed into the housing wall 1. This means that the first opening in the housing wall 1 has in internal thread that matches the first external thread of the first threaded bolt 6. In particular the internal thread of the first opening in the housing wall 1 and the first external thread of the first threaded bolt 6 can both be metric. In this form of embodiment it is possible for the first threaded nut or the second threaded nut to be omitted. The first threaded nut and the second threaded nut can also be omitted. Likewise it is possible for the first retaining nut or the second retaining nut to be omitted. The first retaining nut and the second retaining nut can also be omitted. It is further possible for the first flat nut or the second flat nut to be omitted. The first flat nut and the second flat nut can also be omitted.

In some embodiments, the first threaded bolt 6 essentially runs at right angles to the first and the second side of the housing wall 1. In some embodiments, the first threaded bolt 6 runs at right angles to the first and the second side of the housing wall 1.

Arranged on the second side of the housing wall 1 is a circuit board holder 2. In some embodiments, the circuit board holder 2 is arranged on the inner side of the device, for example on the inner side of the electrical and/or electronic device. In this case the second side of the housing wall 1 and the circuit board holder 2 can be spaced apart for example by two millimeters or one millimeter or half a millimeter. In some embodiments, the distance between the second side of the housing wall 1 and the circuit board holder 2 is small or very small.

The circuit board holder 2 can for example be manufactured from a metal such as aluminum and/or steel and/or ferritic steel and/or austenitic steel. The circuit board holder 2 can likewise be manufactured from a plastic such as for example polyvinyl chloride and/or polyethylene terephthalate and/or acrylonitrile butadiene styrene copolymer. The lists of the materials of the circuit board holder 2 given here are not definitive.

In some embodiments, the circuit board holder 2 is manufactured in an injection molding method. The circuit board holder 2 or parts of the circuit board holder 2 are manufactured according to one aspect of the present disclosure with an additive manufacturing method such as three-dimensional printing. The manufacture of the circuit board holder 2 and/or of parts of the circuit board holder 2 can be undertaken in a specific form of embodiment by selective laser sintering.

The circuit board holder 2 has a first side and a second side. The first side of the circuit board holder 2 is different from the second side of the circuit board holder 2. The first side of the circuit board holder 2 lies opposite the second side of the circuit board holder 2. In some embodiments, the first side of the circuit board holder 2 is parallel to the second side of the circuit board holder 2.

In some embodiments, the first side of the circuit board holder 2 lies opposite the second side of the housing wall 1. In some embodiments, the first side of the circuit board holder 2 and the second side of the housing wall 1 are essentially arranged in parallel. In some embodiments, the first side of the circuit board holder 2 and the second side of the housing wall 1 can be arranged in parallel. The first side of the circuit board holder 2 and the first side of the housing wall 1 can further be arranged in parallel. What is more the second side of the circuit board holder 2 and the second side of the housing wall 1 can be arranged in parallel. Over and above this the second side of the circuit board holder 2 and the first side of the housing wall 1 can be arranged in parallel.

The circuit board holder 2 has a first opening. The first opening in the circuit board holder 2 preferably has a circular cross section. The first opening in the circuit board holder 2 can furthermore have a square, rectangular or hexagonal cross section. The list of cross sections of the first opening in the circuit board holder 2 given here does not make any claim to being complete.

In some embodiments, the first opening in the circuit board holder 2 is a hole. In some embodiments, the first opening is punched into circuit board holder 2. Further technical options for making the first opening in the circuit board holder 2 are well known. For example the first opening in the circuit board holder 2 can be made as a cutout as a part of an additive manufacturing method.

The first threaded bolt 6 is fed through the first opening in the circuit board holder 2. In some embodiments, the first threaded bolt 6 comprises a first hollow cylinder with a first external thread in the area of the circuit board holder 2, for example with a first metric external thread. The first threaded bolt 6 in the area of the circuit board holder 2 is ideally a first hollow cylinder with a first external thread, for example with a first metric external thread.

In some embodiments, the first threaded bolt 6 essentially runs at right angles to the first and the second side of the circuit board holder 2. Ideally the first threaded bolt 6 runs at right angles to the first and the second side of the circuit board holder 2.

Inserted between the circuit board holder 2 and the housing wall 1 is a first spacer piece. In some embodiments, a first spacer piece is inserted between the circuit board holder 2 and the second side of the housing wall 1. In some embodiments, a section of the first threaded bolt 6 runs within the first spacer piece.

The first spacer piece is manufactured from a material that is compatible with the material of the first threaded bolt 6 and with the housing wall 1. The first spacer piece is likewise manufactured from a material that is compatible with the material of the circuit board holder 2. The first spacer piece is further likewise manufactured from a material that is compatible with the material of the second threaded nut, in particular of the second retaining nut and/or the second flat nut.

The first spacer piece can for example be manufactured from a metal such as aluminum and/or steel and/or ferritic steel and/or austenitic steel and/or brass. The first spacer piece can likewise be manufactured from a plastic. The lists of materials of the first spacer piece given here are not definitive.

The first spacer piece has a length dimension that is parallel to the first threaded bolt 6. In particular the length dimension of the first spacer piece is parallel to an axis of the first threaded bolt 6, wherein the first threaded bolt 6 is essentially cylinder-symmetrical about that axis. In one form of embodiment 6 the first threaded bolt 6, except for its first external thread, is cylinder-symmetrical to that axis of the first threaded bolt 6.

The length dimension of the first spacer piece can for example amount to more than one millimeter or more than two millimeters or more than five millimeters. A sufficient distance between the circuit board holder 2 and the housing wall 1 contributes tor electrical and/or thermal isolation of the two components. A sufficient distance between the circuit board holder 2 and the second side of the housing wall 1 contributes to electrical and/or thermal isolation of the two components.

The first spacer piece has a first side. In some embodiments, the first side of the first spacer piece rests against the second threaded nut. In some embodiments, the first side of the first spacer piece rests against the second retaining nut. In a further form of embodiment the first side of the first spacer piece rests against the second flat nut.

The first spacer piece has a second side. The second side of the first spacer piece is different from the first side of the first spacer piece. In some embodiments, the first and the second side of the first spacer piece are parallel to one another.

The length dimension of the first spacer piece corresponds to a shortest distance between the first and the second side of the first spacer piece. In some embodiments, the length dimension is a shortest distance between the first and the second side of the first spacer piece.

The second side of the first spacer piece rests against the circuit board holder 2. In particular the second side of the first spacer piece rests against the first side of the circuit board holder 2. In some embodiments, the second side of the first spacer piece lies against the first side of the circuit board holder 2.

On the second side of the circuit board holder 2 a third threaded nut 3 is attached to the first threaded bolt 6 so that the third threaded nut 3 rests against the second side of the circuit board holder 2. The third threaded nut 3 preferably comprises a third retaining nut and/or a third flat nut. In some embodiments, the third threaded nut 3 is a third retaining nut and/or a third flat nut. The third threaded nut 3 is for example a third threaded nut 3 with a metric thread on an inner side of the third threaded nut 3.

The third threaded nut 3 is manufactured from a material that is compatible with the material of the first threaded bolt 6. The third threaded nut 3 is likewise manufactured from a material that is compatible with the material of the circuit board holder 2. The third threaded nut 3 can for example be manufactured from a metal such as aluminum and/or steel and/or ferritic steel and/or austenitic steel and/or brass. The third threaded nut 3 can likewise be manufactured from a plastic. The lists of materials of the third threaded nut 3 given here are not definitive.

The third threaded nut 3 is arranged opposite the first spacer piece. Arranged between the third threaded nut 3 and the first spacer piece is the circuit board holder 2. The third threaded nut 3 and the first spacer piece fasten the first threaded bolt 6 to the circuit board holder 2. The fastening is such that the first threaded bolt 6 is essentially stationary in relation to the circuit board holder 2. In some embodiments, the third threaded nut 3 and the first spacer piece fasten the first threaded bolt 6 to the circuit board holder 2 in such a way that the first threaded bolt 6 is stationary in relation to the circuit board holder 2.

In some embodiments, the third retaining nut and/or third flat nut is arranged lying opposite to the first spacer piece. Arranged between the third retaining nut and/or the third flat nut and the first spacer piece is the circuit board holder 2. The third retaining nut and/or third flat nut and the first spacer piece fasten the first threaded bolt 6 to the circuit board holder 2. The fastening is such that the first threaded bolt 6 is essentially stationary in relation to the circuit board holder 2. In some embodiments, the fastening is such that the first threaded bolt 6 is stationary in relation to the circuit board holder 2.

In some embodiments, the first threaded bolt 6 is screwed into the circuit board holder 2. This means that the first opening in the circuit board holder 2 has an internal thread that matches the first external thread of the first threaded bolt 6. In particular the internal thread of the first opening in the circuit board holder 2 and the first external thread of the first threaded bolt 6 can both be metric. In this form of embodiment it is possible for the third threaded nut 3 or the first spacer piece to be omitted. The third threaded nut 3 and the first spacer piece can also be omitted. Likewise it is possible for the third retaining nut or the first spacer piece to be omitted. The third retaining nut and the first spacer piece can also be omitted. It is further possible for the third flat nut or the first spacer piece to be omitted. The third flat nut and the first spacer piece can also be omitted.

In some embodiments, the first threaded bolt 6 is the only mechanical connection between circuit board holder 2 and housing wall 1. In particular the first threaded bolt 6 is the only mechanical connection between the first side of the circuit board holder 2 and the second side of the housing wall 1.

In some embodiments, the first threaded bolt 6 is not the only mechanical connection between circuit board holder 2 and housing wall 1. In particular the first threaded bolt 6 is not the only mechanical connection between the first side of the circuit board holder 2 and the second side of the housing wall 1. For example at least one mechanical support can be located between circuit board holder 2 and housing wall 1. In particular at least one mechanical support can be located between the first side of the circuit board holder 2 and the second side of the housing wall 1.

In some embodiments, the at least one mechanical support is thicker than the length dimension of the first spacer piece. In this case the thickness of the at least one mechanical support is measured between a first and a second side of the at least one mechanical support. The first side of the at least one mechanical support is different from the second side of the at least one mechanical support. The first side of the at least one mechanical support rests against the second side of the housing wall 1. The second side of the at least one mechanical support rests against the circuit board holder 2. The thickness of the at least one mechanical support can for example amount to more than two millimeters or more than three millimeters or more than six millimeters.

In some embodiments, instead of the first spacer piece, a fourth threaded nut can be attached so that it rests against the first side of the circuit board holder 2. The circuit board holder 2 lies between the third threaded nut 3 on the second side of the circuit board holder 2 and the fourth threaded nut on the first side of the circuit board holder 2. The third threaded nut 3 and the fourth threaded nut fasten the first threaded bolt 6 to the circuit board holder 2. The fastening is such that the first threaded bolt 6 is essentially stationary in relation to the circuit board holder 2. In some embodiments, the third threaded nut 3 and the fourth threaded nut fasten the first threaded bolt 6 to the circuit board holder 2 such the first threaded bolt 6 is stationary in relation to the circuit board holder 2. A rigid connection makes possible an exact positioning of the components, in particular an exact positioning of electrical contacts between the components.

The fourth threaded nut can comprise a fourth retaining nut. In particular the fourth threaded nut can be a fourth retaining nut. In some embodiments, the third retaining nut is arranged lying opposite the fourth retaining nut. Arranged between the third retaining nut and the fourth retaining nut is the circuit board holder 2. The third retaining nut and the fourth retaining nut fasten the first threaded bolt 6 to the circuit board holder 2. The fastening is such that the first threaded bolt 6 is essentially stationary in relation to the circuit board holder 2. In some embodiments, the fastening is such that the first threaded bolt 6 is stationary in relation to the circuit board holder 2.

The fourth threaded nut can comprise a fourth flat nut. In some embodiments, the fourth threaded nut can be a fourth flat nut. In some embodiments, the third flat nut is arranged lying opposite the fourth flat nut. Arranged between the third flat nut and the fourth flat nut is the circuit board holder 2. The third flat nut and the fourth flat nut fasten the first threaded bolt 6 to the circuit board holder 2. The fastening is such that the first threaded bolt 6 is essentially stationary in relation to the circuit board holder 2. In some embodiments, the fastening is such that the first threaded bolt 6 is stationary in relation to the circuit board holder 2.

The circuit board holder 2 can have one or more pillars. The one or more pillars project from the second side of the circuit board holder 2. FIG. 1 shows a circuit board holder 2 with two pillars. The two pillars project from the second side of the circuit board holder 2. In some embodiments, the circuit board holder 2 can also comprise three or more pillars that project from the second side of the circuit board holder 2.

The one or more pillars connect the circuit board holder 2 to a circuit board 4. To this end the one or more pillars can each have a cylindrical recess with an internal thread. The internal thread or the internal threads can be metric internal threads.

A screw secures the circuit board 4 to the respective pillar in each case. The screw or the screws can be metric screws. In a screwed form of embodiment with a pillar the circuit board 4 is arranged between the pillar and the screw. This means that the circuit board 4 has a first and a second side. The first side of the circuit board 4 is different from the second side of the circuit board 4. The first side of the circuit board 4 lies opposite the second side of the circuit board 4. In one form of embodiment the first side of the circuit board 4 is parallel to the second side of the circuit board 4. The first side of the circuit board 4 rests against the pillar. The second side of the circuit board 4 rests against the screw.

In some embodiments, the pillar runs essentially at right angles to the first and to the second side of the circuit board holder 2. Ideally the pillar runs at right angles to the first and to the second side of the circuit board holder 2. In some embodiments, the pillar runs essentially at right angles to the first and to the second side of the circuit board 4. Ideally the pillar runs at right angles to the first and to the second side of the circuit board 4.

In a screwed form of embodiment with a number of pillars the circuit board 4 is arranged between the pillars and the respective screws. This means that the circuit board 4 has a first and a second side. The first side of the circuit board 4 is different from the second side of the circuit board 4. The first side of the circuit board 4 lies opposite the second side of the circuit board 4. In some embodiments, the first side of the circuit board 4 is parallel to the second side of the circuit board 4. The first side of the circuit board 4 rests against the pillars. The second side of the circuit board 4 rests against the screws.

In some embodiments, the pillars run essentially at right angles to the first and to the second side of the circuit board holder 2. Ideally the pillars run at right angles to the first and to the second side of the circuit board holder 2.

In some embodiments, the pillars run essentially at right angles to the first and to the second side of the circuit board 4. In some embodiments, the pillars run at right angles to the first and to the second side of the circuit board 4.

In some embodiments, the pillar or the pillars each have a recess at their respective end. In each case a rivet secures the circuit board 4 to the respective pillar. In a riveted form of embodiment with a pillar the circuit board 4 is arranged between the pillar and the rivet. This means that the circuit board 4 has a first and a second side. The first side of the circuit board 4 is different from the second side of the circuit board 4. The first side of the circuit board 4 lies opposite the second side of the circuit board 4. In some embodiments, the first side of the circuit board 4 is parallel to the second side of the circuit board 4. The first side of the circuit board 4 rests against the pillar. The second side of the circuit board 4 rests against the rivet.

In some embodiments, the pillar runs essentially at right angles to the first and to the second side of the circuit board holder 2. In some embodiments, the pillar runs at right angles to the first and to the second side of the circuit board holder 2.

In some embodiments, the pillar runs essentially at right angles to the first and to the second side of the circuit board 4. In some embodiments, the pillar runs at right angles to the first and to the second side of the circuit board 4.

In a riveted form of embodiment with a number of pillars the circuit board 4 is arranged between the pillars and the respective rivets. This means that the circuit board 4 has a first and a second side. The first side of the circuit board 4 is different from the second side of the circuit board 4. The first side of the circuit board 4 lies opposite the second side of the circuit board 4. In some embodiments, the first side of the circuit board 4 is parallel to the second side of the circuit board 4. The first side of the circuit board 4 rests against the pillars. The second side of the circuit board 4 rests against the rivets.

In some embodiments, the pillars run essentially at right angles to the first and to the second side of the circuit board holder 2. In some embodiments, the pillars run at right angles to the first and to the second side of the circuit board holder 2.

In some embodiments, the pillars run essentially at right angles to the first and to the second side of the circuit board 4. In some embodiments, the pillars run at right angles to the first and to the second side of the circuit board 4.

In some embodiments, a glue point secures the circuit board 4 to the respective pillar in each case. This means that the circuit board 4 has a first and a second side. The first side of the circuit board 4 is different from the second side of the circuit board 4. The first side of the circuit board 4 lies opposite the second side of the circuit board 4. In some embodiments, the first side of the circuit board 4 is parallel to the second side of the circuit board 4. The first side of the circuit board 4 rests against the pillar and the glue point.

In some embodiments, the pillar runs essentially at right angles to the first and to the second side of the circuit board holder 2. In some embodiments, the pillar runs at right angles to the first and to the second side of the circuit board holder 2.

In some embodiments, the pillar runs essentially at right angles to the first and to the second side of the circuit board 4. In some embodiments, the pillar runs at right angles to the first and to the second side of the circuit board 4.

In an adhesively bonded form of embodiment with a number of pillars the circuit board 4 once again has a first and a second side. The first side of the circuit board 4 is different from the second side of the circuit board 4. The first side of the circuit board 4 lies opposite the second side of the circuit board 4. In one form of embodiment the first side of the circuit board 4 is parallel to the second side of the circuit board 4. The first side of the circuit board 4 rests against the pillars and the glue points.

In some embodiments, the pillars run essentially at right angles to the first and to the second side of the circuit board holder 2. In some embodiments, the pillars run at right angles to the first and to the second side of the circuit board holder 2.

In some embodiments, the pillars run essentially at right angles to the first and to the second side of the circuit board 4. In some embodiments, the pillars run at right angles to the first and to the second side of the circuit board 4.

Regardless of the realization of the fastening of the circuit board 4 the circuit board holder 2 is essentially stationary in relation to the circuit board 4. In some embodiments, the circuit board holder 2 is stationary in relation to the circuit board 4. Regardless of the realization of the fastening of the circuit board 4 the housing wall 1 is essentially stationary in relation to the circuit board 4. In some embodiments, the housing wall 1 is stationary in relation to the circuit board 4. Regardless of the realization of the fastening of the circuit board 4 the first threaded bolt 6 is essentially stationary in relation to the circuit board 4. In some embodiments, the first threaded bolt 6 is stationary in relation to the circuit board 4. A rigid connection makes possible an exact positioning of the components, in particular an exact positioning of electrical contacts between the components.

Regardless of the realization of the fastening of the circuit board 4 the pillar or the pillars have a length dimension. In forms of embodiment with precisely one pillar the pillar has a length dimension. A first end of the pillar is located at the intersection between the second side of the circuit board holder 2 and the pillar. A second end of the pillar is aligned in the direction of the first side of the circuit board 4. The first end of the pillar is different from the second end of the pillar.

In some embodiments, the length dimension of the pillar between the first and the second end of the pillar is greater than three millimeters. The length dimension of the pillar between the first and the second end of the pillar can also be greater than six millimeters. In some embodiments, the length dimension of the pillar between the first and the second end of the pillar can also be longer than twelve millimeters.

In forms of embodiment with a number of pillars the pillars each have a length dimension. A first end of each of the pillars is located at the intersection between the second side of the circuit board holder 2 and the respective pillar. A second end of each of the pillar is aligned in the direction of the first side of the circuit board 4. For each pillar the first end of the pillar is different from the second end of the pillar.

In some embodiments, the length dimension of each of the pillars between the first and the second end of the respective pillar is greater than three millimeters. The length dimension of each pillar between the first and the second end of the respective pillar can also be greater than six millimeters. Finally the length dimension of each of the pillars between the first and the second end of the respective pillar can also be longer than twelve millimeters.

In accordance with one aspect of the form of embodiment with a number of pillars all pillars are the same length. This means that all pillars essentially have the same length dimension between their respective first and second ends. In particular all pillars can have the same length dimension between their respective first and second ends. Thus adaptations to different length dimensions of the pillars are dispensed with.

In some embodiments, the circuit board holder 2 and the pillar or the pillars are manufactured in one piece. This means that no pillar and no pillars has or have to be attached afterwards to the circuit board holder 2. In some embodiments, the circuit board holder 2 and the pillar or the pillars are manufactured in one piece in an injection molding method. The circuit board holder 2 and the pillar or the pillars are manufactured according to one aspect of the present disclosure with a additive manufacturing method such a three-dimensional printing The one-piece manufacturing of the circuit board holder 2 and of the pillar or of the pillars can be undertaken in a specific form of embodiment by selective laser sintering.

A sufficient distance between the circuit board 4 and the circuit board holder 2 and the housing wall 1 additionally protects the components on the circuit board 4 against external influences.

The circuit board 4 can for example be manufactured from a plastic such as laminated epoxy resin and/or laminated polyimides and/or laminated polytetrafluorethylenes. The circuit board 4 can likewise be manufactured from a combination of the aforementioned polymers. The lists of materials given here for the circuit board 4 are not definitive. Preferably the circuit board 4 is around 1.6 millimeters thick. The thickness of the circuit board 4 relates to a shortest distance between the first and the second side of the circuit board 4.

A circuit board 4 in accordance with standard dimensions reduces adaptation of the solution to non-standard components. The complexity of the solution is thereby reduced.

Figure 2:
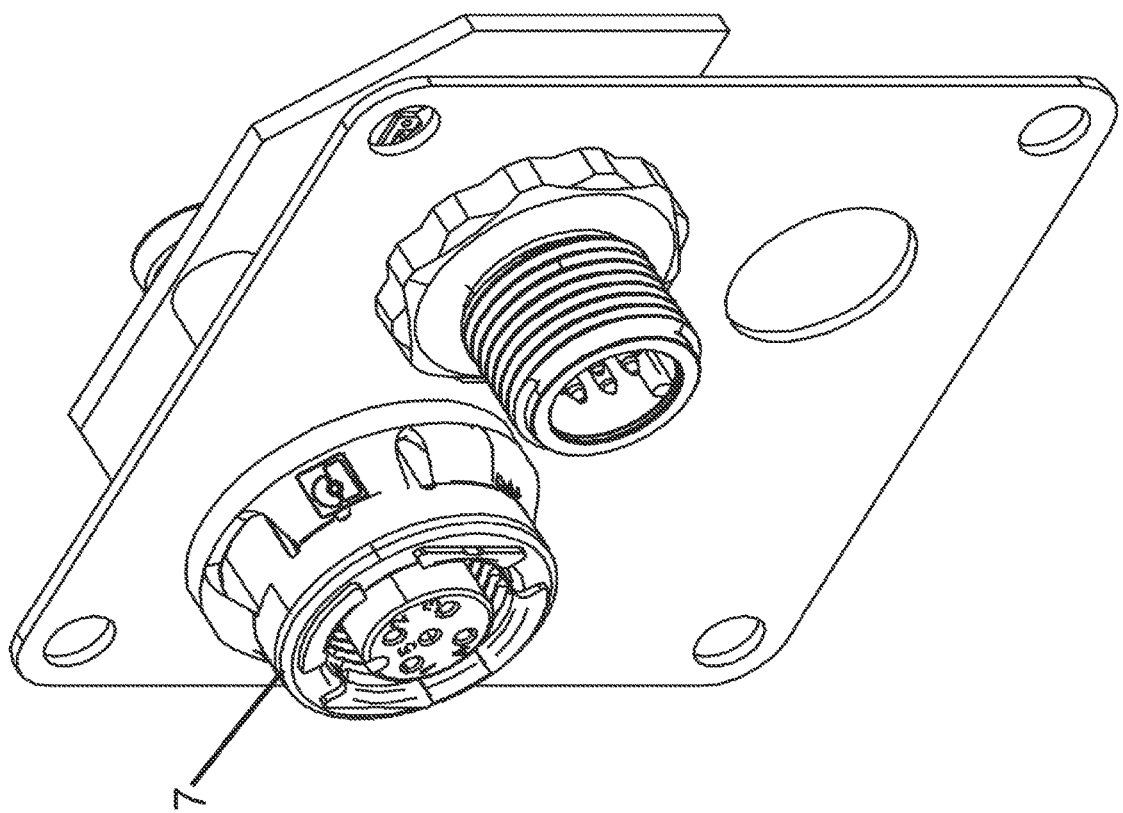
FIG. 2 shows a further diagram of a part of the device with attached circuit board holder and with a circuit board incorporating teachings of the present disclosure.

FIG. 2 shows a second threaded bolt 7. The second threaded bolt 7 is optional. The second threaded bolt 7 is different from the first threaded bolt 6. In some embodiments, the second threaded bolt 7 comprises a second hollow cylinder with a second external thread, for example with a second metric external thread. In some embodiments, the second threaded bolt 7 is a second hollow cylinder with a second external thread, for example with a second metric external thread.

In some embodiments, the first threaded bolt 6 and the second threaded bolt 7 have the same types of external thread. Ideally the first threaded bolt 6 and the second threaded bolt 7 each have metric external threads. The same types of external threads afford a high proportion of the same parts. The complexity of the solution is thus reduced.

In the event of a second threaded bolt 7 being present the housing wall 1 has a second opening. The second opening in the housing wall 1 preferably has a circular cross section. The second opening in the housing wall 1 can furthermore have a square, rectangular or hexagonal cross section. The list of cross sections of the second opening in the housing wall 1 given here does not make any claim to being complete.

In some embodiments, the second opening in the housing wall 1 is a hole. In some embodiments, the second opening is punched into the housing wall 1. Further technical options for making the second opening in the housing wall 1 are well known. For example, the second opening in the housing wall 1 can be made as a cutout as part of manufacturing with an additive manufacturing method.

A second threaded bolt 7 is fed through the second opening in the housing wall 1. In some embodiments, the second threaded bolt 7 comprises a second hollow cylinder with a second external thread, for example with a second metric external thread. In some embodiments, the second threaded bolt 7 is a second hollow cylinder with a second external thread, for example with a second metric external thread.

The second hollow cylinder of the second threaded bolt 7 is manufactured from a material that is compatible with the material of the housing wall 1. The second hollow cylinder of the second threaded bolt 7 can for example be manufactured from a metal such as aluminum and/or steel and/or ferritic steel and/or austenitic steel and/or brass. The second hollow cylinder of the second threaded bolt 7 can likewise be manufactured from a plastic. The lists of materials given here for the second hollow cylinder of the second threaded bolt 7 are not definitive.

A fifth threaded nut is attached to the first side of the housing wall 1 to the second threaded bolt 7 so that the fifth threaded nut rests against the first side of the housing wall 1. In some embodiments, the fifth threaded nut comprises a fifth retaining nut and/or a fifth flat nut. The fifth threaded nut is ideally a fifth retaining nut and/or a fifth flat nut. The fifth threaded nut is for example a fifth threaded nut with a metric thread on an inner side of the fifth threaded nut.

The fifth threaded nut is manufactured from a material that is compatible with the material of the second threaded bolt 7. The fifth threaded nut is likewise manufactured from a material that is compatible with the material of the housing wall 1. The fifth threaded nut can for example be manufactured from a metal such as aluminum and/or steel and/or ferritic steel and/or austenitic steel and/or brass. The fifth threaded nut can likewise be manufactured from a plastic. The lists of materials given here for the fifth threaded nut are not definitive.

A sixth threaded nut is attached to the second threaded bolt 7 on the second side of the housing wall 1 so that the sixth threaded nut rests against the second side of the housing wall 1. In some embodiments, the sixth threaded nut comprises a sixth retaining nut and/or a sixth flat nut. In some embodiments, the sixth threaded nut is a sixth retaining nut and/or a sixth flat nut. The sixth threaded nut is for example a sixth threaded nut with a metric thread on an inner side of the sixth threaded nut.

The sixth threaded nut is manufactured from a material that is compatible with the material of the second threaded bolt 7. The sixth threaded nut is likewise manufactured from a material that is compatible with the material of the housing wall 1. The sixth threaded nut can for example be manufactured from a metal such as aluminum and/or steel and/or ferritic steel and/or austenitic steel and/or brass. The sixth threaded nut can likewise be manufactured from a plastic. The lists on materials given here for the sixth threaded nut are not definitive.

The sixth threaded nut is arranged opposite the fifth threaded nut. Arranged between the sixth threaded nut and the fifth threaded nut is the housing wall 1. The sixth threaded nut and the fifth threaded nut fasten the second threaded bolt 7 to the housing wall 1. The fastening is such that the second threaded bolt 7 is essentially stationary in relation to the housing wall 1. In some embodiments, the sixth threaded nut and the fifth threaded nut fasten the second threaded bolt 7 to the housing wall 1 in such a way that, the second threaded bolt 7 is stationary in relation to the housing wall 1. A rigid connection makes possible an exact positioning of the components, in particular an exact positioning of electrical contacts between the components.

In some embodiments, the sixth retaining nut is arranged opposite the fifth retaining nut. Arranged between the sixth retaining nut and the fifth retaining nut is the housing wall 1. The sixth retaining nut and the fifth retaining nut fasten the second threaded bolt 7 to the housing wall 1. The fastening is such that the second threaded bolt 7 is essentially stationary in relation to the housing wall 1. In some embodiments, the sixth retaining nut and the fifth retaining nut fasten the second threaded bolt 7 to the housing wall 1 in such a way that the second threaded bolt 7 is stationary in relation to the housing wall 1.

In some embodiments, the sixth flat nut is arranged opposite the fifth flat nut. Arranged between the sixth flat nut and the fifth flat nut is the housing wall 1. The sixth flat nut and the fifth flat nut fasten the second threaded bolt 7 to the housing wall 1. The fastening is such that the second threaded bolt 7 is essentially stationary in relation to the housing wall 1. In some embodiments, the sixth flat nut and the fifth flat nut fasten the second threaded bolt 7 to the housing wall 1 in such a way that the second threaded bolt 7 is stationary in relation to the housing wall 1.

In some embodiments, the second threaded bolt 7 is screwed into the housing wall 1. This means that the second opening in the housing wall 1 has an internal thread that matches the second external thread of the second threaded bolt 7. In particular the internal thread of the second opening in the housing wall 1 and the second external thread of the second threaded bolt 7 can both be metric. In this form of embodiment it is possible for the fifth threaded nut or the sixth threaded nut to be omitted. The fifth threaded nut and the sixth threaded nut can also be omitted. Likewise it is possible for the fifth retaining nut or the sixth retaining nut to be omitted. The fifth retaining nut and the sixth retaining nut can also be omitted. It is further possible for the fifth flat nut or the sixth flat nut to be omitted. The fifth flat nut and the sixth flat nut can also be omitted.

In some embodiments, the second threaded bolt 7 essentially runs at right angles to the first and to the second side of the housing wall 1. In some embodiments, the second threaded bolt 7 runs at right angles to the first and to the second side of the housing wall 1.

In one form of embodiment with a second threaded bolt 7 the circuit board holder 2 has a second opening. In some embodiments, the second opening in the circuit board holder 2 has a circular cross section. The second opening in the circuit board holder 2 can furthermore have a square, rectangular or hexagonal cross section. The list of cross sections of the second opening in the circuit board holder 2 does not make any claim to being complete.

In some embodiments, the second opening in the circuit board holder 2 is a hole. In some embodiments, the second opening is punched into the circuit board holder 2. Further technical options for making the first opening in the circuit board holder 2 are well known. For example the second opening in the circuit board holder 2 can be made as a cutout as part of manufacturing with an additive manufacturing method.

In some embodiments, the first and the second opening in the circuit board holder 2 can be present in the form of a single opening in the circuit board holder 2. This means that the first and the second opening in the circuit board holder 2 are not different from one another.

The second threaded bolt 7 is fed through the second opening in the circuit board holder 2. In some embodiments, the second threaded bolt 7 comprises a second hollow cylinder with a second external thread, for example with a second metric external thread, in the area of the circuit board holder 2. In some embodiments, the second threaded bolt 7 is a second hollow cylinder with a second external thread, for example with a second metric external thread, in the area of the circuit board holder 2.

In some embodiments, the second threaded bolt 7 essentially runs at right angles to the first and to the second side of the circuit board holder 2. In some embodiments, the second threaded bolt 7 runs at right angles to the first and to the second side of the circuit board holder 2.

Inserted between the circuit board holder 2 and of the housing wall 1 is a second spacer piece. In some embodiments, a second spacer piece is inserted between the circuit board holder 2 and the second side of the housing wall 1. In some embodiments, a section of the second threaded bolt 7 runs within the second spacer piece.

The second spacer piece is manufactured from a material that is compatible with the material of the second threaded bolt 7. The second spacer piece is likewise manufactured from a material that is compatible with the material of the circuit board holder 2. The second spacer piece is further likewise manufactured from a material that is compatible with the material of the sixth threaded nut, in particular of the sixth retaining nut and/or of the sixth flat nut.

The second spacer piece can for example be manufactured from a metal such as aluminum and/or steel and/or ferritic steel and/or austenitic steel and/or brass. The second spacer piece can likewise be manufactured from a plastic. The lists of materials given here for the second spacer piece are not definitive.

The second spacer piece has a length dimension that is parallel to the second threaded bolt 7. In particular the length dimension of the second spacer piece is parallel to an axis of the second threaded bolt 7, wherein the second threaded bolt 7 is essentially cylinder-symmetrical about that axis. In some embodiments, the second threaded bolt 7, except for its second external thread, is cylinder-symmetrical to that axis of the second threaded bolt 7.

The length dimension of the second spacer piece can for example amount to more than one millimeter or more than two millimeters or more than five millimeters. A sufficient distance between the circuit board holder 2 and the housing wall 1 contributes to the electrical and/or thermal isolation of both components. A sufficient distance between the circuit board holder 2 and the second side of the housing wall 1 contributes to the electrical and/or thermal isolation of both components.

The second spacer piece has a first side. In some embodiments, the first side of the second spacer piece rests against the sixth threaded nut. In some embodiments, the first side of the second spacer piece rests against the sixth retaining nut. In some embodiments, the first side of the second spacer piece rests against the sixth flat nut.

The second spacer piece has a second side. The second side of the second spacer piece is different from the first side of the second spacer piece. In some embodiments, the first and the second side of the second spacer piece are parallel to one another.

The length dimension of the second spacer piece corresponds to a shortest distance between the first and the second side of the second spacer piece. In some embodiments, the length dimension is a shortest distance between the first and the second side of the second spacer piece.

In some embodiments, the length dimension of the second spacer piece is essentially the same as the length dimension of the first spacer piece. In some embodiments, the length dimension of the second spacer piece is the same as the length dimension of the first spacer piece. The same length dimensions of the first and second spacer piece afford a high proportion of the same parts. Thus the complexity of the solution is reduced.

The second side of the second spacer piece rests against the circuit board holder 2. In some embodiments, the second side of the second spacer piece rests against the first side of the circuit board holder 2. In some embodiments, the second side of the second spacer piece rests against the first side of the circuit board holder 2.

A seventh threaded nut is attached to the second threaded bolt 7 on the second side of the circuit board holder 2 so that the seventh threaded nut rests against the second side of the circuit board holder 2. In some embodiments, the seventh threaded nut comprises a seventh retaining nut and/or a seventh flat nut. The seventh threaded nut is ideally a seventh retaining nut and/or a seventh flat nut. The seventh threaded nut is for example a seventh threaded nut with a metric thread on an inner side of the seventh threaded nut.

The seventh threaded nut is manufactured from a material that is compatible with the material of the second threaded bolt 7. The seventh threaded nut is likewise manufactured from a material that is compatible with the material of the circuit board holder 2. The seventh threaded nut can for example be manufactured from a metal such as aluminum and/or steel and/or ferritic steel and/or austenitic steel and/or brass. The seventh threaded nut can likewise be manufactured from a plastic. The lists of materials given here for the seventh threaded nut are not definitive.

The seventh threaded nut is arranged lying opposite the second spacer piece. Arranged between the seventh threaded nut and the second spacer piece is the circuit board holder 2. The seventh threaded nut and the second spacer piece fasten the second threaded bolt 7 to the circuit board holder 2. The fastening is such that the second threaded bolt 7 is essentially stationary in relation to the circuit board holder 2. In some embodiments, the seventh threaded nut and the second spacer piece fasten the second threaded bolt 7 to the circuit board holder 2 in such a way that the second threaded bolt 7 is stationary in relation to the circuit board holder 2.

In some embodiments, the seventh retaining nut and/or seventh flat nut is arranged lying opposite the second spacer piece. Arranged between the seventh retaining nut and/or the seventh flat nut and the second spacer piece is the circuit board holder 2. The seventh retaining nut and/or seventh flat nut and the second spacer piece fasten the second threaded bolt 7 to the circuit board holder 2. The fastening is such that the second threaded bolt 7 is essentially stationary in relation to the circuit board holder 2. In some embodiments, the fastening is such that the second threaded bolt 7 is stationary in relation to the circuit board holder 2.

In some embodiments, the second threaded bolt 7 is screwed into the circuit board holder 2. This means that the second opening in the circuit board holder 2 has an internal thread that matches the second external thread of the second threaded bolt 7. In particular the internal thread of the second opening in the circuit board holder 2 and the second external thread of the second threaded bolt 7 can both be metric. In this form of embodiment it is possible for the seventh threaded nut or the second spacer piece to be omitted. The seventh threaded nut and the second spacer piece can also be omitted. Likewise it is possible for the seventh retaining nut or the second spacer piece to be omitted. The seventh retaining nut and the second spacer piece can also be omitted. It is further possible for the seventh flat nut or the second spacer piece to be omitted. The seventh flat nut and the second spacer piece can also be omitted.

In some embodiments, instead of the second spacer piece, an eighth threaded nut can be attached so that it rests against the first side of the circuit board holder 2. The circuit board holder 2 lies between the seventh threaded nut on the second side of the circuit board holder 2 and the eighth threaded nut on the first side of the circuit board holder 2. The seventh threaded nut and the eighth threaded nut fasten the second threaded bolt 7 to the circuit board holder 2. The fastening is such that the second threaded bolt 7 is essentially stationary in relation to the circuit board holder 2. In some embodiments, the seventh threaded nut and the eighth threaded nut fasten the second threaded bolt 7 to the circuit board holder 2 in such a way that the second threaded bolt 7 is stationary in relation to the circuit board holder 2. A rigid connection makes possible an exact positioning of the components, in particular an exact positioning of electrical contacts between the components.

In some embodiments, the eighth threaded nut can comprise an eighth retaining nut. In particular the eighth threaded nut can be an eighth retaining nut. In some embodiments, the seventh retaining nut is arranged lying opposite the eighth retaining nut. Arranged between the seventh retaining nut and the eighth retaining nut is the circuit board holder 2. The seventh retaining nut and the eighth retaining nut fasten the second threaded bolt 7 to the circuit board holder 2. The fastening is such that the second threaded bolt 7 is essentially stationary in relation to the circuit board holder 2. In some embodiments, the fastening is such that the second threaded bolt 7 is stationary in relation to the circuit board holder 2.

In some embodiments, the eighth threaded nut can comprise an eighth flat nut. In particular the eighth threaded nut can be an eighth flat nut. In some embodiments, the seventh flat nut is arranged lying opposite the eighth flat nut. Arranged between the seventh flat nut and the eighth flat nut is the circuit board holder 2. The seventh flat nut and the eighth flat nut fasten the second threaded bolt 7 to the circuit board holder 2. The fastening is such that the second threaded bolt 7 is essentially stationary in relation to the circuit board holder 2. In some embodiments, the fastening is such that the second threaded bolt 7 is stationary in relation to the circuit board holder 2.

FIG. 2 shows an end of the first threaded bolt 6. The end of the first threaded bolt 6 is aligned in the direction of the circuit board 4. At the end of the first threaded bolt 6 at least one first conductor projects from the first hollow cylinder of the first threaded bolt 6. In some embodiments, at the end of the first threaded bolt 6, a first plurality of conductors projects from the first hollow cylinder of the first threaded bolt 6. The first plurality of conductors that projects from the first hollow cylinder of the first threaded bolt 6 can for example comprise two or five or ten conductors.

In some embodiments, at least one first electrical conductor, for example a first electrical copper conductor, projects from the first hollow cylinder of the first threaded bolt 6. In another form of embodiment a first plurality of electrical conductors, for example a first plurality of electrical copper conductors, projects from the first hollow cylinder of the first threaded bolt 6. At least one first optical conductor, for example a first optical waveguide, can further project from the hollow cylinder of the first threaded bolt 6. In particular at least one first electrical conductor and at least one first optical conductor can project from the first hollow cylinder of the first threaded bolt 6.

A first stopper can be fitted to the end of the first threaded bolt 6. The first stopper may be fitted internally into the first hollow cylinder of the first threaded bolt 6. The first stopper fastens the at least one first conductor or the first plurality of conductors. In particular the first stopper can fasten the at least one first electrical conductor or the first plurality of electrical conductors. The first stopper can further fasten the at least one first electrical conductor and the at least one first optical conductor.

The fastening by the first stopper is initially in relation to the first threaded bolt 6. The fastening is further in relation to the circuit board 4. This means that the at least one first conductor is aligned by the first stopper so that it can be fitted directly on the circuit board 4. For example the at least one first conductor can be soldered directly to the circuit board 4. In particular it is possible for the at least one first electrical conductor to be soldered directly to the circuit board 4. The first plurality of conductors can further be aligned so that the conductors of the first plurality of conductors can be fitted directly to the circuit board 4. For example, the conductors of the first plurality of conductors can be soldered directly to the circuit board 4. In particular it is possible for the electrical conductors of the first plurality of conductors to be soldered directly to the circuit board 4.

A first male or female screw-on plug can further be attached to the end of the first threaded bolt 6. There is then a mating piece for the first male or female screw-on plug of the first threaded bolt 6 on the circuit board 4. The first male or female screw-on plug makes it possible to fasten the at least one first conductor or the first plurality of conductors to the circuit board 4. To this end the first male or female screw-on plug is screwed to its first mating piece. In some embodiments, the at least one first electrical conductor or the first plurality of electrical conductors can be fastened with the aid of the first screw-on plug and the first mating piece. The at least one first copper conductor or the first plurality of copper conductors can also be fastened with the aid of the first screw-on plug and the first mating piece. Thus the first electrical conductor or the first electrical conductors is or are connected with the aid of the first screw-on plug and the first mating piece directly to the circuit board 4.

In some embodiments, the alignment and direct connection means that all cable-to-circuit board connections between the first stopper and the circuit board 4 are dispensed with. The arrangement is thereby more robust in relation to mechanical effects and is less complex.

In some embodiments, at least one first optical conductor is aligned by the first stopper so that it can be connected directly to the circuit board 4. Furthermore, a first plurality of optical conductors can be aligned by the first stopper. The alignment is such that the optical conductors of the first plurality of optical conductors can be connected directly to the circuit board 4.

The at least one first optical conductor can further be connected directly to the circuit board 4 with the aid of the first male or female screw-on plug. A first plurality of optical conductors can furthermore be connected directly to the circuit board 4 with the aid of the first male or female screw-on plug.

In some embodiments, the first male or female screw-on plug can contain a first temperature sensor. The first temperature sensor can for example be a first temperaturedependent electrical capacitor. The circuit board 4 makes contact with the first temperature sensor electrically by the first male or female screw-on plug being screwed to its first mating piece. The first temperature sensor in this way makes a temperature measurement possible in or at the first male or female screw-on plug. This enables an overheating screw-on plug or an overheating electrical connection to be detected.

A second threaded bolt 7 can also be present. FIG. 2 shows an end of the second threaded bolt 7. The end of the second threaded bolt 7 is aligned in the direction of the circuit board 4. At the end of the second threaded bolt 7 at least one second conductor projects from the second hollow cylinder of the second threaded bolt 7. In some embodiments, a second plurality of conductors projects from the second hollow cylinder of the second threaded bolt 7 at the end of the second threaded bolt 7. The second plurality of conductors that projects from the second hollow cylinder of the second threaded bolt 7 can for example comprise two or five or ten conductors.

In some embodiments, the at least one second electrical conductor, for example a second electrical copper conductor, projects from the second hollow cylinder of the second threaded bolt 7. In some embodiments, a second plurality of electrical conductors, for example a second plurality of electrical copper conductors, projects from the second hollow cylinder of the second threaded bolt 7. At least one second optical conductor, for example a second optical waveguide, can also project from the second hollow cylinder of the second threaded bolt 7. In particular at least one second electrical conductor and at least one second optical conductor can project from the second hollow cylinder of the second threaded bolt 7.

A second stopper can be attached to the end of the second threaded bolt 7. The second stopper may be attached internally in the second hollow cylinder of the second threaded bolt 7. The second stopper fastens the at least one second conductor or the second plurality of conductors. In some embodiments, the second stopper can fasten the at least one second electrical conductor or the second plurality of electrical conductors. The second stopper can further fasten the at least one second electrical conductor and the at least one second optical conductor.

The fastening by the second stopper is initially in relation to the second threaded bolt 7. The fastening is further in relation to the circuit board 4. This means that the at least one second conductor is aligned by the second stopper so that it can be attached directly to the circuit board 4. For example the at least one second conductor can be soldered directly to the circuit board 4. In particular it is possible for the at least one second electrical conductor to be able to be soldered directly to the circuit board 4. The second plurality of conductors can further be aligned so that the conductors of the second plurality of conductors can be attached directly to the circuit board 4. In some embodiments, the conductors of the second plurality of conductors can be soldered directly to the circuit board 4. In particular it is possible for the electrical conductors of the second plurality of conductors to be soldered directly to the circuit board 4.

A second male or female screw-on plug can further be attached to the end of the second threaded bolt 7. There is then a second mating piece on the circuit board 4 for the second male or female screw-on plug of the second threaded bolt 7. The second male or female screw-on plug makes possible the fastening of the at least one second conductor or the second plurality of conductors to the circuit board 4. To this end the second male or female screw-on plug is screwed to its second mating piece.

In some embodiments, the at least one second electrical conductor or the second plurality of electrical conductors can be fastened with the aid of the second male or female screw-on plug and the second mating piece. The at least one second copper conductor or the second plurality of copper conductors can also be fastened with the aid of the second male or female screw-on plug and of the second mating piece. Thus the second electrical conductor or the second electrical conductors are connected directly to the circuit board 4 with the aid of the second male or female screw-on plug and of the second mating piece.

In some embodiments, the alignment and direct connection means that all cable-to-circuit board connections between the second stopper and the circuit board 4 are dispensed with. The arrangement is thereby more robust in relation to mechanical effects and less complex.

In some embodiments, the at least one second optical conductor is aligned by the second stopper so that it can be connected directly to the circuit board 4. In some embodiments, a second plurality of optical conductors can be aligned by the second stopper. The alignment is such that the optical conductors of the second plurality of optical conductors can be connected directly to the circuit board 4.

The at least one second optical conductor can further be connected directly to the circuit board 4 with the aid of the second male or female screw-on plug. In some embodiments, a second plurality of optical conductors can be connected directly to the circuit board 4 with the aid of the second male or female screw-on plugs.

In some embodiments, the second screw-on plug is different from the first screw-on plug to the extent that the second screw-on plug makes it possible to compensate for tolerances. In some embodiments, the second screw-on plug can comprise an elastic part for the purpose of compensating for tolerances.

Lengths, thicknesses, diameters and surfaces of this disclosure relate to three hundred Kelvin and to one thousand and thirteen hectopascals, unless stated otherwise.

In some embodiments, an arrangement for fastening a circuit board (4) comprises: a first tubular fastening element (6) and at least one first conductor within the first tubular fastening element (6); the arrangement additionally comprising a mount (2) for the circuit board (4); wherein the mount (2) comprises at least one protrusion for mechanical fastening of the circuit board (4); wherein the mount (2) comprises a first opening; wherein the first tubular fastening element (6) is fed through the first opening in the mount (2); wherein the first tubular fastening element (6) is connected mechanically to the mount (2) on a fixed basis in such a way that the mount (2) is essentially stationary in relation to the first tubular fastening element (6); the arrangement additionally comprising a first terminal for rigid connection of the at least one first conductor to the circuit board (4); wherein the first tubular fastening element (6) comprises an end which is oriented away from the mount (2); and wherein the first terminal is arranged at the end of the first tubular fastening element (6).

In some embodiments, the first tubular fastening element (6) has an interior. The at least one first conductor runs in the interior of the first tubular fastening element (6). The interior of the first tubular fastening element (6) can be hollow. This means that the interior of the first tubular fastening element (6) is a hollow space.

In some embodiments, the first tubular fastening element (6) is connected mechanically with a positive fit to the mount (2), so that the mount (2) is essentially stationary in relation to the first tubular fastening element (6).

In some embodiments, the circuit board (4) comprises an electrical circuit board (4). In some embodiments, the circuit board (4) is an electrical circuit board (4). In some embodiments, the circuit board (4) comprises a printed electrical circuit board (4). In some embodiments, the circuit board (4) is a printed electrical circuit board (4). In some embodiments, the circuit board (4) comprises a printable electrical circuit board (4). In some embodiments, the circuit board (4) is a printable electrical circuit board (4).

In some embodiments, the first tubular fastening element (6) comprises a first and essentially cylindrical fastening element (6). In some embodiments, the first tubular fastening element (6) comprises a first and cylindrical fastening element (6).

In some embodiments, the first terminal is a first terminal for fixed connection of the at least one first conductor to the circuit board (4). The first terminal can further be a first terminal for fixed connection of the at least one first conductor to the circuit board (4).

In some embodiments, the first terminal comprises a first rigid connection of the at least one first conductor to the circuit board (4). In some embodiments, the first terminal comprises a first fixed connection of the at least one first conductor to the circuit board (4). In some embodiments, the first terminal comprises a first fixed connection of the at least one first conductor to the circuit board (4).

In some embodiments, the at least one protrusion comprises a first end and a second end. The second end of the at least one protrusion is different from the first end of the at least one protrusion. The first end of the at least one protrusion connects the at least one protrusion with the mount (2). The second end of the at least one protrusion is for mechanical fastening of the circuit board (4) to the at least one protrusion and to the mount (2).

The first tubular fastening element (6) comprises an end, which is oriented towards the circuit board (4). In some embodiments, the at least one protrusion and the first tubular fastening element (6) are each oriented away from the mount (2). In some embodiments, the at least one protrusion comprises a first end and a second end, wherein the second end of the at least one protrusion is different from the first end of the at least one protrusion, wherein the first end of the at least one protrusion connects the at least one protrusion to the mount (2), wherein the second end of the at least one protrusion is for mechanical fastening of the circuit board (4) to the at least one protrusion and to the mount (2), wherein the second end of the at least one protrusion defines a first direction, wherein the second end of the at least one protrusion and the end of the first tubular fastening element (6) are oriented away in the first direction from the mount (2).

In some embodiments, the first tubular fastening element (6) is connected mechanically to the mount (2) on a fixed basis in such a way that the mount (2) is stationary in relation to the first tubular fastening element (6).

In some embodiments, the first tubular fastening element (6) is screwed to the mount (2) on a fixed basis in such a way that the mount (2) is essentially stationary in relation to the first tubular fastening element (6). In some embodiments, the first tubular fastening element (6) is screwed to the mount (2) on a fixed basis in such a way that the mount (2) is stationary in relation to the first tubular fastening element (6). In some embodiments, the first tubular fastening element (6) is adhesively bonded to the mount (2) on a fixed basis in such a way that the mount (2) is essentially stationary in relation to the first tubular fastening element (6).

In some embodiments, the first tubular fastening element (6) is adhesively bonded to the mount (2) on a fixed basis in such a way that the mount (2) is stationary in relation to the first tubular fastening element (6). In some embodiments, the first tubular fastening element (6) is connected to the mount (2) on a fixed basis with the aid of a shrink fit in such a way that the mount (2) is essentially stationary in relation to the first tubular fastening element (6). In some embodiments, the first tubular fastening element (6) is connected to the mount (2) on a fixed basis with the aid of a shrink fit in such a way that the mount (2) is stationary in relation to the first tubular fastening element (6).

In some embodiments, the arrangement additionally comprises the circuit board (4); wherein the circuit board (4) is fastened mechanically to the mount (2) with the aid of the at least one protrusion; and wherein the at least one first conductor is rigidly connected to the circuit board (4) with the aid of the first terminal. In some embodiments, the first terminal comprises a first electrical terminal and wherein the at least one first conductor comprises at least one first electrical conductor.

In some embodiments, the first terminal is a first electrical terminal. In some embodiments, the at least one first conductor is at least a first electrical conductor. In some embodiments, the first terminal comprises a first terminal for an optical waveguide and wherein the at least one first conductor comprises at least one first optical waveguide.

In some embodiments, the first terminal is a first terminal for an optical waveguide. In some embodiments, the at least one first conductor is at least one first optical waveguide. Optical waveguides provide advantages for example in environments with a danger of explosion. In such environments electrical connections should be reduced to a minimum.

In some embodiments, the first tubular fastening element (6) is arranged at right angles to the mount (2).

In some embodiments, the first tubular fastening element (6) has a first axis of symmetry; wherein the first tubular fastening element (6) is essentially cylinder-symmetrical to the first axis of symmetry of the first tubular fastening element (6); and wherein the first axis of symmetry of the first tubular fastening element (6) runs at right angles to the mount (2).

In some embodiments, the first tubular fastening element (6) has a first axis of symmetry; wherein the first tubular fastening element (6) is cylinder-symmetrical to the first axis of symmetry of the first tubular fastening element (6); and wherein the first axis of symmetry of the first tubular fastening element (6) runs at right angles to the mount (2).

In some embodiments, the mount (2) and the at least one protrusion for mechanical fastening of the circuit board (4) are made as one piece.

In some embodiments, the mount (2) and the at least one protrusion for mechanical fastening of the circuit board (4) may be one piece. The mount (2) and the at least one protrusion for mechanical fastening of the circuit board (4) can be made from one piece for example with the aid of an injection molding method or with the aid of an additive method. The complexity of the arrangement can thus be reduced. Furthermore the likelihood of a failure is reduced since fewer parts are to be connected and fewer connection points can break as a result of mechanical loading.

In some embodiments, the arrangement additionally comprises a housing wall (1); wherein the housing wall (1) comprises a first opening; wherein the first tubular fastening element (6) is fed through the first opening in the housing wall (1); and wherein the first tubular fastening element (6)

is connected mechanically to the housing wall (1) on a fixed basis in such a way that the housing wall (1) is essentially stationary in relation to the first tubular fastening element (6).

In some embodiments, the first tubular fastening element (6) is connected mechanically to the housing wall (1) on a fixed basis in such a way that the housing wall (1) is stationary in relation to the first tubular fastening element (6).

In some embodiments, the first tubular fastening element (6) is mechanically connected to the housing wall (1) with a positive fit so that the housing wall (1) is essentially stationary in relation to the first tubular fastening element (6).

In some embodiments, there is a housing wall (1), wherein the mount (2) comprises a first and a second side; wherein the second side of the mount (2) is different from the first side of the mount (2); wherein the second side of the mount (2) lies opposite the first side of the mount (2); wherein the first side of the mount (2) is oriented in the direction of the housing wall (1); and wherein the at least one protrusion for mechanical fastening of the circuit board (4) projects from the second side of the mount (2).

In some embodiments, the second side of the mount (2) and the first side of the mount (2) form sides of the mount (2) lying opposite one another. In some embodiments, there is a housing wall (1), wherein the mount (2) is arranged between the housing wall (1) and the first terminal.

In some embodiments, the mount (2) is arranged between the housing wall (1) and the circuit board (4).

In some embodiments, there is a housing wall (1), wherein the first tubular fastening element (6) is arranged at right angles to the housing wall (1).

In some embodiments, the first tubular fastening element (6) has a first axis of symmetry; wherein the first tubular fastening element (6) is essentially cylinder-symmetrical to the first axis of symmetry of the first tubular fastening element (6); and wherein the first axis of symmetry of the first tubular fastening element (6) runs at right angles to the housing wall (1).

In some embodiments, the first tubular fastening element (6) has a first axis of symmetry; wherein the first tubular fastening element (6) is cylinder-symmetrical to the first axis of symmetry of the first tubular fastening element (6); and wherein the first axis of symmetry of the first tubular fastening element (6) runs at right angles to the housing wall (1).

In some embodiments, there is a housing wall (1), wherein the first tubular fastening element (6) is the only mechanical connection between the mount (2) and the housing wall (1).

In some embodiments, there is a housing wall (1), wherein the first tubular fastening element (6) is the only tubular mechanical connection between the mount (2) and the housing wall (1).

In some embodiments, there is a housing wall (1), wherein the first tubular fastening element (6) is essentially the only mechanical connection between the mount (2) and the housing wall (1).

In some embodiments, there is a housing wall (1), wherein the first terminal comprises a first male or female screw-on plug, so that the first male or female screw-on plug makes possible the rigid connection of the at least one first conductor to the circuit board (4).

In some embodiments, the first terminal comprises a first male or female screw-on plug, so that the first male or female screw-on plug makes possible a fixed connection of the at least one first conductor to the circuit board (4). In some embodiments, the first terminal comprises a first male or female screw-on plug, so that the first male or female screw-on plug makes possible a fixed connection of the at least one first conductor to the circuit board (4).

In some embodiments, the first terminal comprises a first male or female screw-on plug, so that the first male or female screw-on plug together with a first female or male screw-on plug on the circuit board (4) makes possible the rigid connection of the at least one first conductor to the circuit board (4). In some embodiments, the first terminal comprises a first male or female screw-on plug, so that the first male or female screw-on plug together with a first female or male screw-on plug on the circuit board (4) makes possible a fixed connection of the at least one first conductor to the circuit board (4). In some embodiments, the first terminal comprises a first male or female screw-on plug, so that the first male or female screw-on plug together with a first female or male screw-on plug on the circuit board (4) makes possible a fixed connection of the at least one first conductor to the circuit board (4).

In some embodiments, there is a non-exclusive first tubular fastening element (6), the arrangement comprising: a second tubular fastening element (7) and at least one second conductor inside the second tubular fastening element (7); wherein the mount (2) comprises a second opening; wherein the second tubular fastening element (7) is fed through the second opening in the mount (2); the arrangement additionally comprising a second terminal for rigid connection of the at least one second conductor to the circuit board (4); wherein the second tubular fastening element (7) comprises an end that is oriented away from the mount (2); and wherein the second terminal is arranged at the end of the second tubular fastening element (7).

The second tubular fastening element (7) is different from the first tubular fastening element (6). The at least one second conductor is different from the at least one first conductor. The at least one second opening in the mount (2) is different from the at least one first opening in the mount (2). The second terminal is different from the first terminal.

In some embodiments, the second tubular fastening element (7) comprises a second and essentially cylindrical fastening element (7). In some embodiments, the second tubular fastening element (7) comprises a second and cylindrical fastening element (7).

In some embodiments, the second terminal is a second terminal for fixed connection of the at least one second conductor to the circuit board (4). The second terminal can further be a second terminal for fixed connection of the at least one second conductor to the circuit board (4).

In some embodiments, the second terminal comprises a second rigid connection of the at least one second conductor to the circuit board (4). In some embodiments, the second terminal comprises a second fixed connection of the at least one second conductor to the circuit board (4). In some embodiments, the second terminal comprises a second fixed connection of the at least one second conductor to the circuit board (4).

The second tubular fastening element (7) comprises an end that is oriented towards the circuit board (4). In some embodiments, the at least one protrusion and the second tubular fastening element (7) are each oriented away from the mount (2). In some embodiments, the at least one protrusion comprises a first end and a second end, wherein the second end of the at least one protrusion is different from the first end of the at least one protrusion, wherein the first end of the at least one protrusion connects the at least one protrusion to the mount (2), wherein the second end of the at least one protrusion is for mechanical fastening of the circuit board (4) to the at least one protrusion and to the mount (2), wherein the second end of the at least one protrusion defines a second direction, wherein the second end of the at least one protrusion and the end of the second tubular fastening element (7) are oriented away from the mount (2) in the second direction. In some embodiments, the first direction corresponds to the second direction. In some embodiments, the first direction is the same as the second direction.

In some embodiments, there is a second terminal, the arrangement additionally comprising the circuit board (4); wherein the circuit board (4) is fastened mechanically to the mount (2) with the aid of the at least one protrusion; and wherein the at least one second conductor is rigidly connected to the circuit board (4) with the aid of the second terminal.

In some embodiments, there is a second tubular fastening element (7), wherein the second tubular fastening element (7) is connected mechanically to the mount (2) on a fixed basis in such a way that the mount (2) is essentially stationary in relation to the second tubular fastening element (7).

In some embodiments, the second tubular fastening element (7) is connected mechanically to the mount (2) on a fixed basis in such a way that the mount (2) is stationary in relation to the second tubular fastening element (7).

In some embodiments, the second tubular fastening element (7) is screwed to the mount (2) on a fixed basis in such a way that the mount (2) is essentially stationary in relation to the second tubular fastening element (7). In some embodiments, the second tubular fastening element (7) is screwed to the mount (2) on a fixed basis in such a way that the mount (2) is stationary in relation to the second tubular fastening element (7). In some embodiments, the second tubular fastening element (7) is adhesively bonded to the mount (2) on a fixed basis in such a way that the mount (2) is essentially stationary in relation to the second tubular fastening element (7). In some embodiments, the second tubular fastening element (7) is adhesively bonded to the mount (2) on a fixed basis in such a way that the mount (2) is stationary in relation to the second tubular fastening element (7). In some embodiments, the second tubular fastening element (7) is connected to the mount (2) on a fixed basis with the aid of a shrink fit in such a way that the mount (2) is essentially stationary in relation to the second tubular fastening element (7). In some embodiments, the second tubular fastening element (7) is connected to the mount (2) on a fixed basis with the aid of a shrink fit in such a way that the mount (2) is stationary in relation to the second tubular fastening element (7).

In some embodiments, there is a second terminal, wherein the second terminal comprises a second electrical terminal and wherein the at least one second conductor comprises at least one second electrical conductor. In some embodiments, the second terminal is a second electrical terminal. In some embodiments, the at least one second conductor is at least one second electrical conductor.

In some embodiments, there is a second terminal, wherein the second terminal comprises a second terminal for an optical waveguide and wherein the at least one second conductor comprises at least one second optical waveguide. In some embodiments, the second terminal is a second terminal for an optical waveguide. In some embodiments, the at least one second conductor is at least one second optical waveguide. Optical waveguides provide advantages for example in environments with a danger of explosion. In such environments electrical connections should be reduced to a minimum.

In some embodiments, there is a second tubular fastening element (7), wherein the second tubular fastening element (7) is arranged at right angles to the mount (2).

In some embodiments, the second tubular fastening element (7) has a second axis of symmetry; wherein the second tubular fastening element (7) is essentially cylinder-symmetrical to the second axis of symmetry of the second tubular fastening element (7); and wherein the second axis of symmetry of the second tubular fastening element (7) runs at right angles to the mount (2).

In some embodiments, the second tubular fastening element (7) has a second axis of symmetry; wherein the second tubular fastening element (7) is cylinder-symmetrical to the second axis of symmetry of the second tubular fastening element (7); and wherein the second axis of symmetry of the second tubular fastening element (7) runs at right angles to the mount (2).

In some embodiments, there is a second tubular fastening element (7), wherein the second tubular fastening element (7) is arranged parallel to the first tubular fastening element (6).

In some embodiments, the first tubular fastening element (6) has a first axis of symmetry and the second tubular fastening element (7) has a second axis of symmetry; wherein the first tubular fastening element (6) is essentially cylinder-symmetrical to the first axis of symmetry of the first tubular fastening element (6); wherein the second tubular fastening element (7) is essentially cylinder-symmetrical to the second axis of symmetry of the second tubular fastening element (7); and wherein the first axis of symmetry is parallel to the second axis of symmetry.

In some embodiments, the first tubular fastening element (6) has a first axis of symmetry and the second tubular fastening element (7) has a second axis of symmetry; wherein the first tubular fastening element (6) is cylinder-symmetrical to the first axis of symmetry of the first tubular fastening element (6); wherein the second tubular fastening element (7) is cylinder-symmetrical to the second axis of symmetry of the second tubular fastening element (7); and wherein the first axis of symmetry is parallel to the second axis of symmetry.

In some embodiments, there is a second tubular fastening element (7), wherein the second terminal comprises a second male or female screw-on plug, wherein the second male or female screw-on plug comprises an elastic element, so that the elastic element and the second male or female screw-on plug afford the rigid connection of the at least one second conductor to the circuit board (4).

In some embodiments, the second terminal comprises a second male or female screw-on plug, wherein the second male or female screw-on plug comprises an elastic element, so that the elastic element and the second male or female screw-on plug afford the fixed connection of the at least one second conductor to the circuit board (4). In some embodiments, the second terminal comprises a second male or female screw-on plug, wherein the second male or female screw-on plug comprises an elastic element, so that the elastic element and the second male or female screw-on plug afford the fixed connection of the at least one second conductor to the circuit board (4).

In some embodiments, the second terminal comprises a second male or female screw-on plug, wherein the second male or female screw-on plug comprises an elastic element, so that the elastic element and the second male or female screw-on plug together with a second female or male screw-on plug on the circuit board (4) afford the rigid connection of the at least one second conductor to the circuit board (4). In some embodiments, the second terminal comprises a second male or female screw-on plug, wherein the second male or female screw-on plug comprises an elastic element, so that the elastic element and the second male or female screw-on plug together with a second female or male screw-on plug on the circuit board (4) afford the fixed connection of the at least one second conductor to the circuit board (4). In some embodiments, the second terminal comprises a second male or female screw-on plug, wherein the second male or female screw-on plug comprises an elastic element, so that the elastic element and the second male or female screw-on plug together with a second female or male screw-on plug on the circuit board (4) afford the fixed connection of the at least one second conductor to the circuit board (4).

The elastic element of the second male or female screw-on plug makes possible a lateral movement of contacts. As a result tolerances can be more easily adhered to.

In some embodiments, a device, in particular an electrical device, comprises one of the aforementioned arrangements. In some embodiments, the device, in particular the electrical device, comprises a housing wall (1), wherein the mount (2) of one of the aforementioned arrangements is mechanically fastened to the housing wall (1). In some embodiments, the housing wall (1) comprises an inner side and the mount (2) is fastened to the inner side of the housing wall (1). The device, in particular the electrical device, comprises an interior and the inner side of the housing wall (1) delimits the interior.

What has been stated here relates to individual example embodiments of the present disclosure. Various changes can be made without deviating from the underlying idea and without departing from the framework of this disclosure. The subject matter of the present disclosure is defined via its claims. Various changes can be made without departing from the scope of protection of the following claims.

REFERENCE CHARACTERS

1: Housing wall
2: Mount, in particular circuit board holder
3: Threaded nut, in particular retaining nut and/or flat nut
4: Circuit board
5: Fastenings, in particular screws and/or rivets
6: First fastening element, in particular first threaded bolt
7: Second fastening element, in particular second threaded bolt

The invention claimed is:

1. An arrangement for fastening a circuit board, the arrangement comprising:
a first tubular fastening element; and
a first conductor inside the first tubular fastening element;
a mount for the circuit board;
wherein the mount comprises: a protrusion for mechanical fastening of the circuit board and a first opening;
wherein the first tubular fastening element is fed through the first opening in the mount;
wherein the first tubular fastening element is connected mechanically to the mount on a fixed basis in such a way that the mount is essentially stationary in relation to the first tubular fastening element;
a first terminal for rigid connection of the first conductor to the circuit board;
wherein the first tubular fastening element comprises an end oriented away from the mount;
wherein the first terminal is arranged on the end of the first tubular fastening element; and
a housing wall with a second opening;
wherein the first tubular fastening element is fed through the second opening;
wherein the first tubular fastening element is connected mechanically to the housing wall on a fixed basis in such a way that the housing wall is essentially stationary in relation to the first tubular fastening element;
wherein the mount comprises a first side and a second side;
wherein the second side lies opposite the first side and the first side of the mount is oriented in the direction of the housing wall;
wherein the protrusion projects from the second side of the mount; and
wherein the mount is arranged between the housing wall and the first terminal.

2. The arrangement as claimed in claim 1, wherein:
the first terminal comprises a first electrical terminal; and
the first conductor comprises a first electrical conductor.

3. The arrangement as claimed in claim 1, wherein:
the first terminal comprises a first terminal for an optical waveguide; and
the first conductor comprises a first optical waveguide.

4. The arrangement as claimed in claim 1, wherein the first tubular fastening element is arranged at right angles to the mount.

5. The arrangement as claimed in claim 1, wherein the mount and the protrusion are made from a single piece.

6. The arrangement as claimed in claim 1, wherein the first tubular fastening element is arranged at right angles to the housing wall.

7. The arrangement as claimed in claim 1, wherein the first tubular fastening element is the only mechanical connection between the mount and the housing wall.

8. The arrangement as claimed in claim 1, wherein the first terminal comprises a first male or female screw-on plug providing the rigid connection of the first conductor to the circuit board.

9. The arrangement as claimed in claim 1, further comprising:
a second tubular fastening element; and
a second conductor inside the second tubular fastening element;
wherein the mount comprises a second opening;
wherein the second tubular fastening element is fed through the second opening in the mount;
a second terminal for rigid connection of the second conductor to the circuit board;
wherein the second tubular fastening element comprises an end oriented away from the mount; and
wherein the second terminal is arranged at the end of the second tubular fastening element.

10. The arrangement as claimed in claim 9, wherein the second tubular fastening element is connected mechanically to the mount on a fixed basis in such a way that the mount is essentially stationary in relation to the second tubular fastening element.

11. The arrangement as claimed in claim 9, wherein the second tubular fastening element is arranged parallel to the first tubular fastening element.

12. The arrangement as claimed in claim 9, wherein the second terminal comprises a second male or female screw-on plug comprising an elastic element, so that the elastic element and the second male or female screw-on plug afford the rigid connection of the second conductor to the circuit board.

* * * * *